United States Patent
Sawamura et al.

(10) Patent No.: US 10,994,517 B2
(45) Date of Patent: May 4, 2021

(54) GLASS SUBSTRATE AND LAMINATED SUBSTRATE

(71) Applicant: AGC INC., Tokyo (JP)

(72) Inventors: Shigeki Sawamura, Tokyo (JP); Kazutaka Ono, Tokyo (JP)

(73) Assignee: AGC INC., Tokyo (JP)

( * ) Notice: Subject to any disclaimer, the term of this patent is extended or adjusted under 35 U.S.C. 154(b) by 0 days.

(21) Appl. No.: 16/355,613

(22) Filed: Mar. 15, 2019

(65) Prior Publication Data

US 2019/0210327 A1    Jul. 11, 2019

Related U.S. Application Data

(63) Continuation of application No. PCT/JP2017/032922, filed on Sep. 12, 2017.

(30) Foreign Application Priority Data

Sep. 16, 2016 (JP) ............................. JP2016-182125
Mar. 23, 2017 (JP) ............................. JP2017-057619

(51) Int. Cl.
*B32B 15/04* (2006.01)
*B32B 17/06* (2006.01)
(Continued)

(52) U.S. Cl.
CPC ...... *B32B 17/10036* (2013.01); *B32B 17/101* (2013.01); *B32B 17/10119* (2013.01);
(Continued)

(58) Field of Classification Search
CPC ....... B32B 17/102; B32B 17/06; C03C 3/087; C03C 3/091; C03C 3/085
(Continued)

(56) References Cited

U.S. PATENT DOCUMENTS 5,459,109 A   10/1995 Lapp
5,741,746 A    4/1998 Kohli et al.
(Continued)

FOREIGN PATENT DOCUMENTS

JP    H08-333133    12/1996
JP    H09-255355     9/1997
(Continued)

OTHER PUBLICATIONS

JP2016160135 English machine translation, 2016.*
(Continued)

*Primary Examiner* — Lauren R Colgan
(74) *Attorney, Agent, or Firm* — Foley & Lardner LLP

(57) ABSTRACT

A first aspect of the present invention relates to a glass substrate having a content of alkali metal oxides, as represented by molar percentage based on oxides, of 0 to 0.1%, a devitrification-temperature viscosity of $10^{3.2}$ dPa·s or higher, and an average coefficient of thermal expansion α at 30 to 220° C. of 7.80 to 9.00 (ppm/° C.). A second aspect of the present invention relates to a glass substrate which is to be used for a support substrate for semiconductor packages, the glass substrate having a content of alkali metal oxides, as represented by molar percentage based on oxides, of 0 to 0.1% and a photoelastic constant of 10 to 26 nm/cm/MPa.

18 Claims, 2 Drawing Sheets

(51) Int. Cl.
*B32B 17/10* (2006.01)
*C03C 3/087* (2006.01)
*C03C 3/091* (2006.01)
*H01L 23/15* (2006.01)
*C03B 19/00* (2006.01)

(52) U.S. Cl.
CPC ........ *B32B 17/10174* (2013.01); *C03B 19/00* (2013.01); *C03C 3/087* (2013.01); *C03C 3/091* (2013.01); *H01L 23/15* (2013.01)

(58) Field of Classification Search
USPC ........................................ 428/426, 428, 688
See application file for complete search history.

(56) References Cited

U.S. PATENT DOCUMENTS

| | | | | |
|---|---|---|---|---|
| 2013/0059718 A1* | 3/2013 | Koyama | ................. | C03B 25/00 501/66 |
| 2015/0086794 A1* | 3/2015 | Akita | ..................... | B32B 17/06 428/427 |
| 2016/0075110 A1* | 3/2016 | Kakuta | ................... | B32B 17/10 428/141 |
| 2016/0082699 A1* | 3/2016 | Kakuta | ............... | C08G 73/1067 156/247 |
| 2018/0082914 A1* | 3/2018 | Hanawa | .................. | C03C 3/085 |
| 2018/0141849 A1* | 5/2018 | Saito | ....................... | C03C 3/091 |

FOREIGN PATENT DOCUMENTS

| | | |
|---|---|---|
| JP | H10-506088 | 6/1998 |
| JP | 2010-218942 A | 9/2010 |
| JP | 2014-088306 A | 5/2014 |
| JP | 2015-078113 A | 4/2015 |
| JP | 2016-160135 A | 9/2016 |

OTHER PUBLICATIONS

International Search Report (with English Translation) and Written Opinion (in Japanese only) for PCT/JP2017/032922 dated Dec. 5, 2017.

* cited by examiner

GLASS SUBSTRATE AND LAMINATED SUBSTRATE

TECHNICAL FIELD

The present invention relates to a glass substrate and a laminated substrate.

BACKGROUND ART

In the field of semiconductor devices, while the degree of integration in devices increases, size reduction in the devices is proceeding. This has resulted in a growing desire for a technique for packaging a device having a high degree of integration.

In the field of semiconductor packages, a technique such as wafer-level packaging (WLP) or panel-level packaging (PLP) is attracting attention in recent years (see, for example, Patent Document 1). In this technique, for example, silicon chips are placed on a glass substrate and encapsulated by molding an encapsulation resin. Terminals can be disposed over an area larger than each silicon chip, rendering efficient wiring possible. As a result, the degree of integration per unit area can be heightened. In addition, a cost reduction can be attained by increasing the area.

In general, encapsulation resins have a higher coefficient of thermal expansion than glass substrates, and there is hence a large difference in the coefficient of thermal expansion between the glass substrates and the encapsulation resins. Because of this, packaging by the WLP technique has a problem in that the package warps due to the difference in the coefficient of thermal expansion. In order to overcome this problem, a measure has hitherto been taken in which various fillers are incorporated into an encapsulation resin to make the coefficient of thermal expansion of the encapsulation resin close to the coefficient of thermal expansion of glass substrates, thereby diminishing the warpage resulting from the packaging step.

BACKGROUND ART DOCUMENTS

Patent Documents

Patent Document 1: JP-A-2015-78113
Patent Document 2: JP-A-8-333133

SUMMARY OF THE INVENTION

Problems that the Invention is to Solve

However, incorporation of a large amount of a filler into an encapsulation resin reduces the flowability of the encapsulation resin, and this poses a problem that the encapsulation resin does not fill all the corners of the space to be filled, resulting in a decrease in reliability. There is hence a desire for a glass substrate having a high coefficient of thermal expansion so that the coefficient of thermal expansion of the glass substrate matches the coefficient of thermal expansion of encapsulation resins, in place of regulating the coefficient of thermal expansion of an encapsulation resin by incorporating a filler thereinto.

Since the WLP or the like described above involves silicon chips, use of a glass substrate containing an alkali metal oxide may pose problems, for example, that the alkali metal oxide becomes ions in a heat treatment step or other steps to contaminate the silicon chips and causes short-circuiting to the LSI circuits or the like formed on the silicon chips. It is hence desired to use a glass substrate having an extremely low alkali metal oxide content.

However, conventional glasses having a high coefficient of thermal expansion contains an alkali metal hydroxide in a large amount. Patent Document 1 discloses a support glass substrate having an average coefficient of linear thermal expansion in the temperature range of 20-200° C. of $50\times10^{-7}$ to $66\times10^{-7}$/° C., but this support glass substrate contains alkali metal oxides such as $Na_2O$ or $K_2O$ in an amount of 5% by mass or more. Patent Document 2 discloses a glass having a coefficient of linear thermal expansion in the temperature range of 0-300° C. of $60$-$90\times10^{-7}$/° C., but this glass contains alkali metal oxides in an amount of about 5% by mass.

Meanwhile, glasses in this field are used in the form of a thin plate and are hence required to be efficiently formed into thin plates. However, conventional alkali-free glasses have a high devitrification temperature and are difficult to form into a substrate, and there is a problem, for example, in that it is necessary to form an alkali-free glass into a block and to subject the block to slicing and grinding.

Accordingly, an object of a first aspect of the present invention is to provide a glass substrate having a minimized alkali metal oxide content and having a higher coefficient of thermal expansion than conventional one with good productivity, and a laminated substrate including the glass substrate. An object of a second aspect of the present invention is to provide a glass substrate having a minimized alkali metal oxide content and suitable for a support substrate for semiconductor packages, and a laminated substrate including the glass substrate.

Means for Solving the Problem

The present inventors have found that when a devitrification-temperature viscosity and an average coefficient of thermal expansion at 30 to 220° C. are set to specific ranges, a glass substrate having a minimized alkali metal oxide content and having a higher coefficient of thermal expansion than conventional one with good productivity is obtained. The first aspect of the present invention has been accomplished based on this finding.

The present inventors have found that when a photoelastic constant C is set to a specific range, a glass substrate having a minimized alkali metal oxide content and capable of being used for a support substrate for semiconductor packages can be obtained. The second aspect of the present invention has been accomplished based on this finding.

The glass substrate according to the first aspect of the present invention has a content of alkali metal oxides, as represented by molar percentage based on oxides, of 0 to 0.1%, a devitrification-temperature viscosity of $10^{3.2}$ dPa·s or higher, and an average coefficient of thermal expansion α at 30 to 220° C. of 7.80 to 9.00 (ppm/° C.).

The glass substrate according to the second aspect of the present invention has a content of alkali metal oxides, as represented by molar percentage based on oxides, of 0 to 0.1% and a photoelastic constant of 10 to 26 nm/cm/MPa, and is to be used for a support substrate for semiconductor packages.

The laminated substrate of the present invention includes the glass substrate and a semiconductor substrate laminated via a resin layer, and the semiconductor substrate is supported by the glass substrate.

The laminated substrate of the present invention includes the glass substrate and another glass substrate laminated therewith.

Advantage of the Invention

The first aspect of the present invention can provide a glass substrate having a minimized alkali metal oxide content and having a higher coefficient of thermal expansion than conventional one with good productivity, and a laminated substrate.

The second aspect of the present invention can provide a glass substrate having a minimized alkali metal oxide content and suitable for a support substrate for semiconductor packages, and a laminated substrate using the glass substrate.

BRIEF DESCRIPTION OF THE DRAWINGS

FIG. 1A is a cross-sectional view showing the glass substrate which has not been laminated; and FIG. 1B is a cross-sectional view showing the glass substrate which has been laminated.

MODES FOR CARRYING OUT THE INVENTION

Embodiments of the invention are explained. Each "-" used for indicating a numerical range means that the numerical values that precede and succeed the symbol are included in the range as the lower limit and the upper limit. Unless otherwise indicated, the symbol "-" used hereinbelow has the same meaning.

In this description, the content of each component in a glass substrate or in a process for production thereof is given as represented by molar percentage based on oxides, unless otherwise indicated.

First, a glass substrate according to one embodiment of the present invention is explained. The following explanations are given mainly on embodiments in which silicon substrates are used as semiconductor substrates, but the glass substrate of the invention can be suitably applicable to semiconductor substrates other than silicon substrates.

Figure 1A:
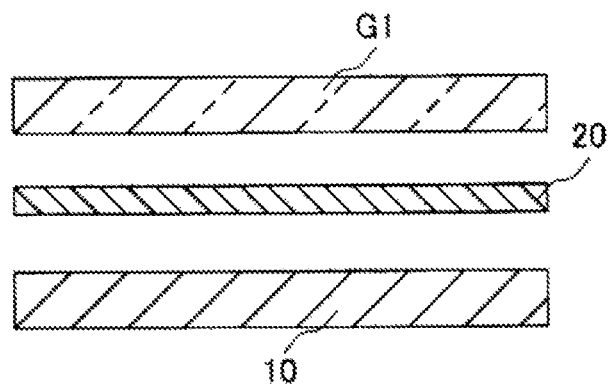
FIG. 1A and FIG. 1B show a glass substrate according to one embodiment of the present invention for laminating to a silicon substrate.
Figure 1B:
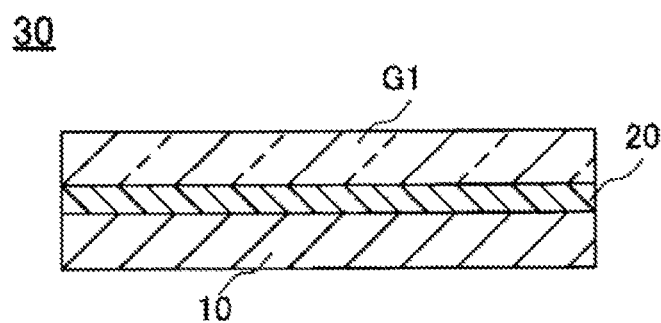

FIG. 1A and FIG. 1B are cross-sectional views of a glass substrate according to one embodiment of the present invention for laminating to a silicon substrate. The glass substrate G1 shown in FIG. 1A, according to one embodiment of the present invention, is laminated to a silicon substrate 10 at a temperature of, for example, 200-400° C., via a release layer 20 (which may function as a bonding layer) interposed therebetween, thereby obtaining a laminated substrate 30 shown in FIG. 1B. As the silicon substrate 10, use is made, for example, of a full-size silicon wafer, a silicon chip, a substrate including silicon chips encapsulated in a resin, a wafer having an element formed thereon, etc. The release layer 20 is, for example, a resin capable of withstanding temperatures of 200-400° C.

A glass substrate according to one embodiment of the present invention is used in applications where the glass substrate is laminated to a silicon substrate. For example, the glass substrate is used as a support substrate for fan-out type wafer-level packages, a glass substrate for image sensors, such as MEMSs, CMOSs, and CISs, for which element size reduction by wafer-level packaging is effective, a glass substrate having through-holes (glass interposer; GIP), a support glass for semiconductor back grinding, etc. A glass substrate according to one embodiment of the present invention is especially suitable as a support substrate for fan-out type wafer-level packaging.

Figure 2:
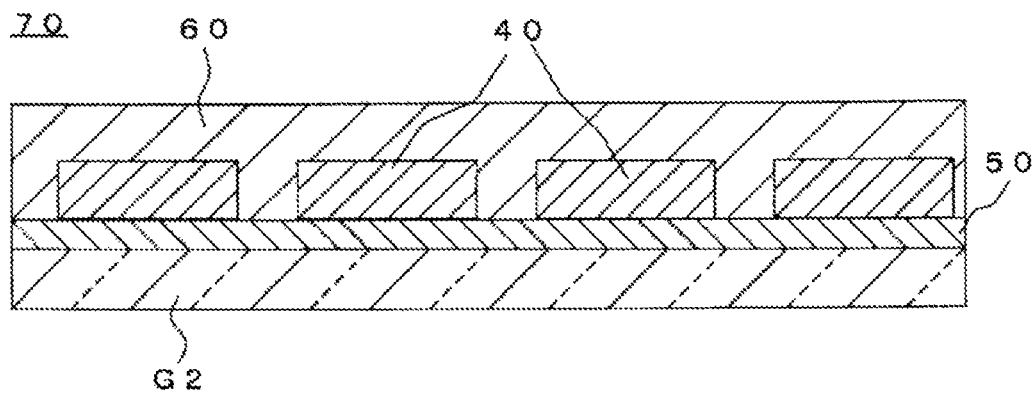
FIG. 2 is a cross-sectional view showing a laminated substrate according to one embodiment of the present invention.

FIG. 2 is a cross-sectional view of a laminated substrate according to one embodiment of the present invention, in which a glass substrate according to one embodiment of the invention is used as a support substrate for fan-out type wafer-level packaging.

In fan-out type wafer-level packaging, silicon substrates 40 (silicon chips) are laminated with a glass substrate G2 at a temperature of, for example, 200-400° C., via a release layer 50 (which may function as a bonding layer) of, for example, a resin. The silicon substrates 40 are then embedded in a resin 60, thereby obtaining a laminated substrate 70. Thereafter, the release layer 50 is irradiated with ultraviolet light through the glass substrate G2, thereby separating the glass substrate G2 from the silicon substrates 40 embedded in the resin 60. The glass substrate G2 can be reused. The silicon substrates 40 embedded in the resin 60 are subjected to wiring with, for example, copper wire. The substrate including the resin 60 and the silicon chips embedded therein may be used as a silicon substrate.

As will be described later, a glass substrate according to one embodiment of the invention has an average coefficient of thermal expansion α at 30-220° C. of 7.80-9.00 (ppm/° C.), which is higher than those of conventional alkali-free glasses, and is easily made to have a coefficient of thermal expansion that matches with the coefficient of thermal expansion of encapsulation resins. This glass substrate is hence suitable for use as a support substrate for fan-out type wafer-level packages.

A glass substrate according to one embodiment of the invention has a content of alkali metal oxides, as represented by molar percentage based on oxides, of 0-0.1%. Examples of the alkali metal oxides include $Li_2O$, $Na_2O$, and $K_2O$. In cases where the content of alkali metal oxides, as represented by molar percentage based on oxides, therein is 0.1% or less, the diffusion of alkali ions into the semiconductor substrate is less apt to occur in a heat treatment step for laminating the glass substrate to a semiconductor substrate, e.g., a silicon substrate, and in a heat treatment step for embedding in an encapsulation resin (resin encapsulation).

The content of alkali metal oxides is more preferably 0.05% or less, even more preferably 0.02% or less, as represented by molar percentage based on oxides. It is especially preferable that the glass substrate contains substantially no alkali metal oxides. The expression "containing substantially no alkali metal oxides" means that the glass substrate contains no alkali metal oxides at all or that the glass substrate may contain alkali metal oxides as unavoidable impurities which has come into the glass in the course of the production thereof.

A glass substrate according to one embodiment of the first aspect of the invention has an average coefficient of thermal expansion α at 30-220° C. of 7.80-9.00 (ppm/° C.). When the α is 7.80-9.00 (ppm/° C.), this coefficient of thermal expansion is sufficiently high as compared with those of conventional alkali-free substrates, and it is easy to match the coefficient of thermal expansion of this glass substrate with the coefficient of thermal expansion of an encapsulation resin. Since the coefficient of thermal expansion of the glass substrate can be matched with that of an encapsulation resin, this glass substrate, through laminating to a semiconductor substrate and a subsequent heat treatment step for embedding in the encapsulation resin, can give a package which as a whole has reduced or no warpage.

A glass substrate according to one embodiment of the first aspect of the invention has α of preferably 7.85 (ppm/° C.) or higher, more preferably 7.90 (ppm/° C.) or higher, even more preferably 8.00 (ppm/° C.) or higher. Meanwhile, the glass substrate according to the first aspect of the invention has α of preferably 8.50 (ppm/° C.) or lower, more preferably 8.40 (ppm/° C.) or lower, even more preferably 8.35 (ppm/° C.) or lower, especially preferably 8.30 (ppm/° C.) or lower.

A glass substrate according to one embodiment of the second aspect of the invention has α of preferably 7.80 (ppm/° C.) or higher, more preferably 7.85 (ppm/° C.) or higher, even more preferably 7.90 (ppm/° C.) or higher, especially preferably 8.00 (ppm/° C.) or higher. Meanwhile, the glass substrate according to the second aspect of the invention has α of preferably 9.00 (ppm/° C.) or lower, more preferably 8.50 (ppm/° C.) or lower, even more preferably 8.40 (ppm/° C.) or lower, especially preferably 8.35 (ppm/° C.) or lower.

The average coefficient of thermal expansion α at 30-220° C. is an average coefficient of thermal expansion determined through a measurement of thermal expansion coefficient made over the temperature range of 30-220° C. by the method as provided for in JIS R3102 (year 1995).

It is preferable that a glass substrate according to one embodiment of the invention has an average coefficient of thermal expansion β at 50-350° C. of 8.10-9.30 (ppm/° C.). In the case where β is 8.10-9.30 (ppm/° C.), it is easy to conduct a heat treatment step for laminating this glass substrate to a silicon substrate to give a laminated substrate so that the laminated substrate has reduced residual stress generated therein. The influence of the release layer disposed between the glass substrate and the silicon substrate is negligible because the release layer is far thinner than the glass substrate and the silicon substrate.

In the case of use as a wafer-level package, the heat treatment step for laminating the glass substrate G2 to silicon substrates 40 (silicon chips) further includes embedding the silicon substrates 40 in a resin 60. In the case where β is 8.10-9.30 (ppm/° C.), it is easy to reduce the residual strain to be generated in the glass substrate G2, silicon substrates 40, and resin 60.

β is more preferably 8.20 (ppm/° C.) or higher, even more preferably 8.25 (ppm/° C.) or higher, especially preferably 8.30 (ppm/° C.) or higher, most preferably 8.35 (ppm/° C.) or higher. Meanwhile, β is more preferably 8.70 (ppm/° C.) or lower, even more preferably 8.65 (ppm/° C.) or lower, especially preferably 8.60 (ppm/° C.) or lower, most preferably 8.55 (ppm/° C.) or lower.

The average coefficient of thermal expansion β at 50-350° C. is an average coefficient of thermal expansion determined through a measurement of thermal expansion coefficient made over the temperature range of 50-350° C. by the method as provided for in JIS R3102 (year 1995).

A glass substrate according to one embodiment of the first aspect of the invention has a devitrification-temperature viscosity ($\eta_{TL}$) of $10^{3.2}$ dPa·s or higher. In the case where the devitrification-temperature viscosity thereof is $10^{3.2}$ dPa·s or higher, stable forming is possible. In addition, forming into thin plates can be conducted efficiently. The devitrification-temperature viscosity of the glass substrate according to one embodiment of the first aspect of the invention is preferably $10^{3.5}$ dPa·s or higher, more preferably $10^{4.0}$ dPa·s or higher.

A glass substrate according to one embodiment of the second aspect of the invention has a devitrification-temperature viscosity ($\eta_{TL}$) of preferably $10^{3.2}$ dPa·s or higher, more preferably $10^{3.5}$ dPa·s or higher, even more preferably $10^{4.0}$ dPa·s or higher.

A glass substrate according to one embodiment of the invention preferably has the following composition. Specifically, the glass substrate is characterized by having a glass matrix composition including, as represented by molar percentage based on oxides, $SiO_2$: 50-70%,
$Al_2O_3$: 2-8%,
$B_2O_3$: 0-5%,
MgO: 0-5%,
CaO: 0-6%,
SrO: 4-20%, and
BaO: 14-35%,
provided that MgO+CaO+SrO+BaO: 25-40%.

$SiO_2$ is a component which forms a network of glass. In the case where the content of $SiO_2$ is 50% or higher, this glass substrate has enhanced chemical resistance to acidic solutions, e.g., solutions of HCl or HF, and alkaline solutions, e.g., solutions of NaOH. In addition, this glass substrate has satisfactory heat resistance and weatherability. The content of $SiO_2$ is more preferably 58% or higher, even more preferably 58.5% or higher. Meanwhile, in the case where the content of $SiO_2$ is 70% or less, this prevents the glass from having too high melt viscosity and imparts satisfactory meltability. The satisfactory meltability enables the glass to be melted at low temperatures, and this reduces the amount of the fuel to be used and renders the melting furnace less apt to be damaged. The content of $SiO_2$ is more preferably 60% or less, even more preferably 59.5% or less.

In the case where the content of $Al_2O_3$ is 2% or higher, this glass substrate has enhanced chemical resistance to acidic solutions, e.g., solutions of HCl or HF, and alkaline solutions, e.g., solutions of NaOH. In addition, this glass substrate has satisfactory weatherability and heat resistance and an increased Young's modulus. The content of $Al_2O_3$ is more preferably 2.5% or higher, even more preferably 3.5% or higher, especially preferably 3.7% or higher. Meanwhile, in the case where the content of $Al_2O_3$ is 8% or less, this prevents the glass from having too high melt viscosity and imparts satisfactory meltability. In addition, this glass can have a lowered devitrification temperature and be stably formed. The content of $Al_2O_3$ is more preferably 7% or less, even more preferably 6% or less, especially preferably 5% or less.

$B_2O_3$ is not an essential component. However, in the case where $B_2O_3$ is contained, this prevents the glass from having too high melt viscosity and imparts satisfactory meltability. In addition, this glass can have a lowered devitrification temperature and be stably formed. Furthermore, in the compositional range for one embodiment of the invention, the boron ion has a coordination number of 4, and this glass hence has an increased Young's modulus unlike ordinary alkali-free glasses having a CTE of about 3-5 ppm/° C. for flat-panel display substrates. When a glass substrate is produced from this glass, the glass substrate can be inhibited from warping or cracking in the slow cooling step, which will be described later. The content of $B_2O_3$ is more preferably 1% or higher, even more preferably 2% or higher. Meanwhile, in the case where the content of $B_2O_3$ is 5% or less, a higher glass transition temperature Tg can be imparted. The content of $B_2O_3$ is more preferably 4% or less, even more preferably 3% or less.

MgO is not an essential component. However, in the case where MgO is contained, this prevents the glass from having too high melt viscosity and imparts satisfactory meltability. In addition, this glass has improved weatherability and an increased Young's modulus. The content of MgO is preferably 1% or higher, more preferably 1.5% or higher. Meanwhile, in the case where the content of MgO is 5% or less, this glass is less apt to devitrify. The content of MgO is more preferably 4% or less, even more preferably 3% or less.

CaO is not an essential component. However, in the case where CaO is contained, this prevents the glass from having too high melt viscosity and imparts satisfactory meltability. In addition, this glass has improved weatherability. The content of CaO is more preferably 1% or higher, even more preferably 2% or higher. Meanwhile, in the case where the content of CaO is 6% or less, this glass can have a lowered devitrification temperature and be stably formed. In addition, the glass substrate has enhanced chemical resistance to acidic solutions, e.g., solutions of HCl or HF, and alkaline solutions, e.g., solutions of NaOH. The content of CaO is more preferably 5.0% or less, even more preferably 4.5% or less, especially preferably 4.0% or less.

In the case where the content of SrO is 4% or higher, this prevents the glass from having too high melt viscosity and imparts satisfactory meltability. This glass further has improved weatherability. In addition, this glass can be made to have an increased coefficient of thermal expansion. Furthermore, such an SrO content has the effect of lowering the photoelastic constant. The content of SrO is more preferably 7% or higher, even more preferably 10% or higher, especially preferably 11% or higher. Meanwhile, in the case where the content of SrO is 20% or less, this glass can have a lowered devitrification temperature and be stably formed. The content of SrO is more preferably 14% or less, even more preferably 13.5% or less, especially preferably 13.0% or less, most preferably 12.0% or less.

In the case where the content of BaO is 14% or higher, this prevents the glass from having too high melt viscosity and imparts satisfactory meltability. This glass further has improved weatherability. In addition, this glass can be made to have an increased coefficient of thermal expansion. Furthermore, such a BaO content is especially effective in lowering the photoelastic constant. The content of BaO is more preferably 17% or higher, even more preferably 19% or higher. Meanwhile, in the case where the content of BaO is 35% or less, this glass can have a lowered devitrification temperature and be stably formed. The content of BaO is preferably 30% or less, more preferably 24% or less, even more preferably 23% or less.

A glass substrate according to one embodiment of the invention preferably has a total content of MgO, CaO, SrO, and BaO of 25-40% as represented by molar percentage based on oxides. In the case where the total content of MgO, CaO, SrO, and BaO is 25% or higher, this prevents the glass from having too high melt viscosity and imparts satisfactory meltability. This glass further has improved weatherability. The total content of MgO, CaO, SrO, and BaO is more preferably 30% or higher, even more preferably 35% or higher, especially preferably 35.5% or higher, most preferably 36% or higher.

Meanwhile, in the case where the total content of MgO, CaO, SrO, and BaO is 40% or less, this glass substrate has enhanced chemical resistance to acidic solutions, e.g., solutions of HCl or HF, and alkaline solutions, e.g., solutions of NaOH. In addition, this glass can have a lowered devitrification temperature and be stably formed. The total content of MgO, CaO, SrO, and BaO is more preferably 38% or less, even more preferably 37% or less.

A glass substrate according to one embodiment of the invention preferably has a value as determined by the following expression (1) of 81-93, the expression (1) showing a relationship of each content proportion of oxides as represented by molar percentage based on oxides.

$$0.174\times(\text{content of SiO}_2)-0.012\times(\text{content of Al}_2O_3)+ \\ 0.317\times(\text{content of B}_2O_3)+0.988\times(\text{content of MgO})+1.715\times(\text{content of CaO})+2.011\times(\text{content of SrO})+2.251\times(\text{content of BaO})+0.076 \quad (1)$$

Expression (1) is a regression expression which indicates a relationship between the glass composition and the average coefficient of thermal expansion at 50-350° C. This regression expression was obtained by determining the average coefficients of thermal expansion at 50-350° C. of about a hundred glasses differing in $SiO_2$ content, $Al_2O_3$ content, $B_2O_3$ content, MgO content, CaO content, SrO content, and BaO content. In the case where the value of expression (1) is 81-93, it is easy to regulate the average coefficient of thermal expansion at 30-220° C. to a value in the range of 7.800-9.000 (ppm/° C.).

The value of expression (1) is preferably 82 or larger, more preferably 82.5 or larger, even more preferably 83 or larger, especially preferably 84 or larger, most preferably 85 or larger. Meanwhile, in the case where the value of expression (1) is 93 or less, it is easy to regulate the coefficient of thermal expansion of the encapsulation resin and that of the glass substrate so as to match with each other in a heat treatment step in resin encapsulation and, hence, the package as a whole is easily made to have reduced warpage. The value of expression (1) is preferably 90 or less, more preferably 88 or less, most preferably 87 or less.

A glass substrate according to one embodiment of the invention preferably has a total content of $SiO_2$ and $Al_2O_3$ of 60% or higher as represented by molar percentage based on oxides. In the case where the total content thereof is 60% or higher, this glass substrate has enhanced chemical resistance to acidic solutions and alkaline solutions. The total content of $SiO_2$ and $Al_2O_3$ is more preferably 63% or higher, even more preferably 63.5% or higher, especially preferably 64% or higher. Meanwhile, the total content of $SiO_2$ and $Al_2O_3$ is preferably 70% or less. In the case where the total content thereof is 70% or less, this prevents the glass from having too high melt viscosity and imparts satisfactory meltability. This glass is prevented from having too low an average coefficient of thermal expansion.

A glass substrate according to one embodiment of the invention may contain $SnO_2$, $SO_3$, Cl, F, etc. Inclusion of $SnO_2$, $SO_3$, Cl, and F makes it possible to produce the glass while inhibiting the formation of bubbles, thereby yielding glass substrates containing few bubbles.

A glass substrate according to one embodiment of the invention may contain $ZrO_2$ in order to improve the weatherability. In the case where $ZrO_2$ is contained, the content thereof is preferably 2% or less, more preferably 1% or less, especially preferably 0.5% or less, as represented by molar percentage based on oxides.

A glass substrate according to one embodiment of the invention may contain ZnO in order to regulate the viscosity or the average coefficient of thermal expansion. In the case where ZnO is contained, the content thereof is preferably 2% or less, more preferably 1% or less, especially preferably 0.5% or less, as represented by molar percentage based on oxides.

A glass substrate according to one embodiment of the invention may contain $Y_2O_3$, $La_2O_3$, and $TiO_2$ in order to improve the chemical resistance and Young's modulus of the glass. The total content of these is preferably 2% or less, more preferably 1% or less, especially preferably 0.5% or less, as represented by molar percentage based on oxides.

A glass substrate according to one embodiment of the invention may contain a reducing agent in order to heighten the ultraviolet transmittance. In the case where reducing agents are contained, the content of each reducing agent is preferably 2% or less, more preferably 1% or less, especially preferably 0.5% or less, most preferably 0.2% or less, as represented by molar percentage based on oxides. Examples of the reducing agent include carbon and coke.

A glass substrate according to one embodiment of the invention preferably contains substantially none of $V_2O_5$, $P_2O_5$, $CeO_2$, $Y_2O_3$, $La_2O_3$, and $TiO_2$, from the standpoints of striae, coloration, etc.

A glass substrate according to one embodiment of the invention preferably contains substantially neither $As_2O_3$ nor $Sb_2O_3$, from the standpoint of environmental burden. From the standpoint of stably conducting float process, it is preferable that this glass substrate contains substantially no ZnO.

A glass substrate according to one embodiment of the invention may contain $Fe_2O_3$. The content of $Fe_2O_3$ may be 10 ppm or higher, may be 20 ppm or higher, or may be 50 ppm or higher, as represented by mass per million based on oxides. The content of $Fe_2O_3$ may be 800 ppm or less, may be 600 ppm or less, or may be 400 ppm or less, as represented by mass per million based on oxides.

In the case where the content of $Fe_2O_3$ is within that range, it is possible to sufficiently lower the infrared transmittance and to inhibit the ultraviolet transmittance from decreasing. Specifically, by incorporating $Fe_2O_3$, the infrared transmittance can be lowered to attain an improvement in energy efficiency in the melting step, making it possible to obtain a glass of high quality. Furthermore, by regulating the content of $Fe_2O_3$ so as to be within that range, the ultraviolet transmittance can be inhibited from decreasing and, hence, a decrease in separation efficiency or the occurrence of separation unevenness can be prevented in irradiating the laminated substrate with ultraviolet light and removing the release layer.

A glass substrate according to one embodiment of the invention preferably has a transmittance of 360 nm-wavelength light of 15% or higher at a thickness of 1 mm. In the case where the 360 nm-wavelength light transmittance of the glass substrate is 15% or higher, this glass substrate can be easily removed, by irradiation with ultraviolet light, from the laminated substrate including the glass substrate and semiconductor substrates laminated via a release layer. The transmittance of 360 nm-wavelength light is more preferably 20% or higher, even more preferably 25% or higher, especially preferably 30% or higher.

A glass substrate according to one embodiment of the second aspect of the invention has a photoelastic constant C of 10-26 nm/cm/MPa. The photoelastic constant C of the glass substrate according to one embodiment of the second aspect of the invention is preferably 12 nm/cm/MPa or higher, more preferably 13 nm/cm/MPa or higher, even more preferably 14 nm/cm/MPa or higher, especially preferably 15 nm/cm/MPa or higher. Meanwhile, the photoelastic constant C of the glass substrate according to one embodiment of the second aspect of the invention is preferably 24 nm/cm/MPa or less, more preferably 21 nm/cm/MPa or less, even more preferably 19 nm/cm/MPa or less, especially preferably 18 nm/cm/MPa or less, most preferably 17 nm/cm/MPa or less.

By regulating the composition to result in a photoelastic constant C of 10 nm/cm/MPa or higher, the glass substrate can be inhibited from being bent by its own weight. This glass substrate, when used as a support substrate for semiconductor packages, can be prevented from arousing troubles due to the bending in conveying steps. In the case where the photoelastic constant C thereof is 10 nm/cm/MPa or higher, there is no need of incorporating SrO, BaO, or the like in too large an amount and, hence, this glass can be prevented from having too high a specific gravity or arousing troubles such as bending due to its own weight. In addition, this glass can be prevented from having enhanced devitrification property.

Meanwhile, in the case where the photoelastic constant C is 26 nm/cm/MPa or less, birefringence can be sufficiently reduced. Such photoelastic constants C are hence preferred. Specifically, in the case where the photoelastic constant C is 26 nm/cm/MPa or less, this glass substrate can have sufficiently low birefringence even in the case where stress has occurred due to a difference in thermal expansion coefficient between the glass substrate and a resin or where the glass substrate has residual stress. Since the birefringence can be sufficiently reduced, failures can be prevented from occurring in steps for irradiation with laser light, which is coherent light (steps for accurate thickness measurement and for separation).

A glass substrate according to one embodiment of the first aspect of the invention has a photoelastic constant C of preferably 10 nm/cm/MPa or higher, more preferably 12 nm/cm/MPa or higher, even more preferably 13 nm/cm/MPa or higher, especially preferably 14 nm/cm/MPa or higher, further especially preferably 15 nm/cm/MPa or higher. Meanwhile, the photoelastic constant C of the glass substrate according to one embodiment of the first aspect of the invention is preferably 26 nm/cm/MPa or less, more preferably 24 nm/cm/MPa or less, even more preferably 21 nm/cm/MPa or less, especially preferably 19 nm/cm/MPa or less, further especially preferably 18 nm/cm/MPa or less, most preferably 17 nm/cm/MPa or less.

A glass substrate according to one embodiment of the invention preferably has a glass devitrification temperature of 1,250° C. or lower. In the case where the glass devitrification temperature thereof is 1,250° C. or lower, stable forming is possible. The glass devitrification temperature thereof is more preferably 1,200° C. or lower, even more preferably 1,170° C. or lower, especially preferably 1,150° C. or lower, most preferably 1,100° C. or lower.

The glass devitrification temperature of a glass is determined by placing crushed particles of the glass on a platinum dish, heat-treating the particles for 17 hours in an electric furnace controlled so as to have a constant temperature, examining the heat-treated glass with an optical microscope to determine a highest temperature at which crystal precipitation occurs in neither the glass surface nor the inside thereof, and taking the highest temperature as the devitrification temperature.

A glass substrate according to one embodiment of the invention preferably has a Young's modulus of 65 GPa or higher. The value of Young's modulus is determined by an ultrasonic pulse method. In the case where the Young's modulus thereof is 65 GPa or higher, the glass substrate can be inhibited from warping or cracking in the slow cooling step, which will be described later, in producing the glass substrate. In addition, the glass substrate can be inhibited from being damaged by contact with silicon substrates in laminating the glass substrate to the silicon substrates or by contact with a peripheral member when the glass substrate is conveyed.

The Young's modulus thereof is more preferably 70 GPa or higher, even more preferably 75 GPa or higher, especially preferably 77 GPa or higher. The Young's modulus thereof is more preferably 100 GPa or less. In the case where the Young's modulus thereof is 85 GPa or less, the glass is inhibited from being brittle, and the glass substrate can be inhibited from chipping during cutting. The Young's modulus thereof is more preferably 82 GPa or less, even more preferably 79 GPa or less.

A glass substrate according to one embodiment of the invention preferably has a thickness of 2.0 mm or less. In the case where the thickness thereof is 2.0 mm or less, a laminated substrate including this glass substrate and a semiconductor substrate laminated thereon can have a reduced size. The thickness thereof is more preferably 1.5 mm or less, even more preferably 1.0 mm or less, especially preferably 0.8 mm or less. The thickness thereof is preferably 0.1 mm or larger. In the case where the thickness thereof is 0.1 mm or larger, this glass substrate can be inhibited from being damaged by contact with semiconductor substrates in laminating the glass substrate to the semiconductor substrates or by contact with a peripheral member when the glass substrate is conveyed. In addition, such a thickness can inhibit the glass substrate from being bent by its own weight. The thickness thereof is more preferably 0.2 mm or larger, even more preferably 0.3 mm or larger.

A glass substrate according to one embodiment of the invention preferably is one in which at least one main surface has an area of 70-7,000 $cm^2$. In the case where the area of the glass substrate is 70 $cm^2$ or larger, a large number of semiconductor substrates can be disposed and an improvement in production efficiency is attained in the step of laminating semiconductor substrates with the glass substrate. The area of the at least one main surface is more preferably 80 $cm^2$ or larger, even more preferably 170 $cm^2$ or larger, especially preferably 300 $cm^2$ or larger, most preferably 700 $cm^2$ or larger.

In the case where the area of the at least one main surface is 7,000 $cm^2$ or less, this glass substrate is easy to handle and can be inhibited from being damaged by contact with semiconductor substrates in laminating the glass substrate to the semiconductor substrates or by contact with a peripheral member when the glass substrate is conveyed. The area of the at least one main surface is more preferably 6,000 $cm^2$ or less, even more preferably 4,000 $cm^2$ or less, especially preferably 3,000 $cm^2$ or less.

A glass substrate according to one embodiment of the invention preferably has a density of 3.70 $g/cm^3$ or less. In the case where the density thereof is 3.70 $g/cm^3$ or less, this glass substrate is lightweight and easy to handle. In addition, this glass substrate can be made less apt to be bent by its own weight. The density thereof is more preferably 3.60 $g/cm^3$ or less, even more preferably 3.55 $g/cm^3$ or less. The density thereof is preferably 2.50 $g/cm^3$ or higher. In the case where the density thereof is 3.00 $g/cm^3$ or higher, this glass can have a heightened Vickers hardness, rendering the glass surface less apt to receive scratches. The density thereof is more preferably 3.10 $g/cm^3$ or higher, even more preferably 3.20 $g/cm^3$ or higher, especially preferably 3.30 $g/cm^3$ or higher, most preferably 3.40 $g/cm^3$ or higher.

A glass substrate according to one embodiment of the invention preferably is one in which the main surface has a circular shape. In the case where the glass substrate is circular, it is easy to laminate this glass substrate with a circular semiconductor substrate, e.g., a silicon substrate. The term "circular" means a shape that is not limited to a complete circle and that may be a circle in which the dimensional deviations from a complete circle having the same diameter are up to 50 μm.

However, the glass substrates are not limited to circular ones, and may be rectangular or have a notch or orientation flat formed in the edge thereof. In the case of a circular shape, a part of the periphery may be straight.

In the case where a glass substrate according to one embodiment of the invention is circular, this glass substrate preferably has a diameter of 7 cm or larger. In the case where the diameter thereof is 7 cm or larger, many semiconductor devices can be obtained from a laminated substrate obtained by laminating this glass substrate to a semiconductor substrate, e.g., a silicon substrate, resulting in an improvement in production efficiency. The diameter thereof is more preferably 10 cm or larger, even more preferably 15 cm or larger, especially preferably 20 cm or larger, most preferably 25 cm or larger. The diameter thereof is preferably 50 cm or less. In the case where the diameter thereof is 50 cm or less, this glass substrate is easy to handle. The diameter thereof is more preferably 45 cm or less, even more preferably 40 cm or less, especially preferably 35 cm or less.

A glass substrate according to one embodiment of the invention preferably has a β-OH of 0.05-0.65 $mm^{-1}$. β-OH is an index to the water content in the glass substrate. By regulating the β-OH to 0.05 $mm^{-1}$ or higher, bubbling can be inhibited in production, thereby yielding a glass substrate containing few bubbles. The β-OH thereof is more preferably 0.1 $mm^{-1}$ or higher, even more preferably 0.15 $mm^{-1}$ or higher, especially preferably 0.17 $mm^{-1}$ or higher. Meanwhile, by regulating the β-OH to 0.65 $mm^{-1}$ or less, the heat resistance can be enhanced. The β-OH thereof is more preferably 0.55 $mm^{-1}$ or less, even more preferably 0.5 $mm^{-1}$ or less, especially preferably 0.45 $mm^{-1}$ or less. The values of β-OH were determined with the following equation.

$$\beta\text{-OH (mm}^{-1}) = -\log_{10}(T_{3500}\text{ cm}^{-1}/T_{4000}\text{ cm}^{-1})/t$$

In the equation, $T_{3500}$ $cm^{-1}$ is the transmittance (%) of light having a wave number of 3,500 $cm^{-1}$, $T_{4000}$ $cm^{-1}$ is the transmittance (%) of light having a wave number of 4,000 $cm^{-1}$, and t is the thickness (mm) of the glass substrate.

A glass substrate according to one embodiment of the invention preferably has a light-shielding film on at least one main surface of the glass substrate. In the case where the glass substrate has a light-shielding film formed on the main surface thereof, it is easy to detect the position of the glass substrate or laminated substrate in the step of inspecting the glass substrate or laminated substrate. The position thereof is determined by detecting reflected light caused by irradiating the glass substrate or laminated substrate with light. Glass substrates are prone to transmit light. By forming a light-shielding film on a main surface of the glass substrate, the reflected light is intensified to facilitate the detection of the position. The light-shielding film preferably contains Ti.

A glass substrate according to one embodiment of the invention preferably has a strain temperature of 620° C. or higher. In the case where the strain temperature thereof is 620° C. or higher, this glass substrate can be inhibited from dimensionally changing in a heat treatment step for, for example, laminating the glass substrate to a semiconductor substrate. The strain temperature thereof is more preferably 650° C. or higher, even more preferably 670° C. or higher, especially preferably 690° C. or higher.

A glass substrate according to one embodiment of the invention preferably has a glass transition temperature (Tg) of 680° C. or higher. In the case where the glass transition temperature (Tg) thereof is 680° C. or higher, this glass substrate can be inhibited from dimensionally changing in a heat treatment step for, for example, resin encapsulation or substrate laminating. The glass transition temperature (Tg) thereof is more preferably 700° C. or higher, even more preferably 705° C. or higher, especially preferably 710° C. or higher.

A glass substrate according to one embodiment of the invention preferably has a temperature ($T_2$) at which a viscosity becomes $10^2$ dPa·s of 1,600° C. or lower. In the case where the $T_2$ is 1,600° C. or lower, this glass has satisfactory meltability. The $T_2$ is more preferably 1,550° C. or lower, even more preferably 1,450° C. or lower, especially preferably 1,425° C. or lower.

The temperature ($T_4$) at which a viscosity becomes $10^4$ dPa·s is preferably 1,200° C. or lower. In the case where the $T_4$ is 1,200° C. or lower, this glass has satisfactory meltability. The $T_4$ is more preferably 1,150° C. or lower, even more preferably 1,125° C. or lower, most preferably 1,100° C. or lower. From the standpoint of the ease of ensuring other physical properties, the temperature ($T_4$) at which the viscosity becomes $10^4$ dPa·s is 1,000° C. or higher.

Next, a support substrate for semiconductor packages according to one embodiment of the invention is explained.

The support substrate for semiconductor packages is the glass substrate described above which is to be laminated with the semiconductor substrate, via a resin layer, and which functions to support the semiconductor substrate. As stated above, this support substrate has a minimized alkali metal oxide content and has a higher coefficient of thermal expansion than conventional support substrates, thereby bringing about excellent production efficiency. Because of this, not only semiconductor packages such as the WLPs or PLPs described above can be produced at low cost, but also it is possible to avoid problems such as the separation of encapsulation resin due to heat generated by the semiconductor chips, etc. Furthermore, it is possible to avoid various problems, for example, that the alkali metal oxides become ions to contaminate the semiconductor substrates and cause short-circuiting to the LSI circuits or the like formed on the semiconductor substrates.

Next, a laminated substrate according to embodiments of the invention is explained.

The laminated substrate according to embodiments includes the glass substrate described above and a semiconductor substrate, e.g., silicon substrate, laminated with the glass substrate. The laminated substrate thus configured has advantages in that alkali ions are less apt to diffuse into the semiconductor substrate in a heat treatment step for laminating the semiconductor substrate to the glass substrate or the like and that it is easy to match the coefficient of thermal expansion of the encapsulation resin with that of the glass substrate, thereby enabling the laminated substrate to be reduced in warpage.

Next, a laminated glass substrate according to embodiments of the invention is explained. The laminated glass substrate according to embodiments includes the glass substrate described above and another glass substrate laminated therewith. A laminated glass substrate according to one embodiment of the invention can be used as the support substrate described above or as a support glass for semiconductor back grinding.

Figure 3:
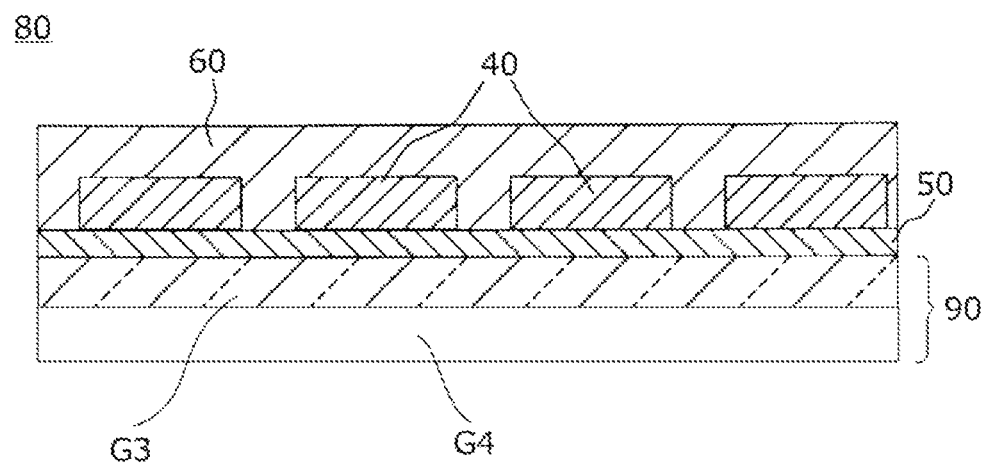
FIG. 3 is a cross-sectional view showing a laminated substrate according to another embodiment of the present invention.

For example, FIG. 3 shows a laminated substrate 80 including a support substrate (support glass) 90 which is a laminated glass substrate including a glass substrate G3 according to one embodiment of the invention and a glass substrate G4 laminated therewith. The thickness of the support substrate 90 can be easily reduced by removing the glass substrate G4 in place of grinding the support substrate 90, without grinding the support substrate 90 and the laminate 80. Even in the case where permissible thicknesses for the support substrate are smaller than the thickness of the glass substrate G3, such a permissible thickness may be obtained by merely removing the G4 and then grinding the G3 in a necessary amount. Thus, the grinding step can be shortened (simplified).

In the laminated substrate 80 shown in FIG. 3, which includes the glass substrate and semiconductor substrates, e.g., silicon substrates, laminated therewith, it is preferable that the support substrate 90 is thick, from the standpoints of preventing warpage after resin encapsulation and reducing the deflection amount of the laminated substrate. The support substrate 90 can have a reduced deflection amount when composed of a plurality of glass substrates (laminated glass substrate) than when constituted of a single glass substrate. Meanwhile, even when a support substrate 90 having a larger thickness is desired, it is difficult to produce a thick single-layer plate by some glass forming methods. By using, as the support substrate 90, a laminated glass substrate obtained by laminating a necessary number of glass substrates each having any desired thickness, the problems shown above can be significantly overcome.

The glass substrates which constitute the support substrate 90 may be the same or different glass substrates. These glass substrates preferably are equal in the coefficient of thermal expansion, from the standpoint of reducing deflection amount in a heat treatment.

In the case where those glass substrates are different glass substrates, the glass substrates may differ in alkali metal oxide content. For example, in the case of FIG. 3, the glass substrate G3 close to the semiconductor substrates is compared with the glass substrate G4 further from the semiconductor substrates, and a substrate having a lower alkali metal oxide content is disposed as the glass substrate G3 and a substrate having a higher alkali metal oxide content is disposed as the glass substrate G4.

As the substrate having a lower alkali metal oxide content to be disposed as the glass substrate G3, use may be made of a glass substrate according to the present invention. Since the glass substrate G3 having a lower alkali metal oxide content lies between the semiconductor substrates and the glass substrate G4, the semiconductor substrates can be prevented from being contaminated by ions generated from the alkali metal oxides contained in the glass substrate G4.

As the glass substrate G4, a glass having a high alkali metal oxide content can be used. This has an advantage in that glasses having a high alkali metal oxide content can be relatively easily formed into substrates, rendering efficient substrate production possible.

Another advantage is that since there are no limitations on the alkali metal oxide content of the glass substrate G4, it is possible to use a known composition having an average coefficient of thermal expansion α at 30-220° C. of higher than 9.00 (ppm/° C.). This makes it possible to regulate the thermal expansion of the entire laminated substrate to further reduce the warpage in a packaging step.

A process for producing a glass substrate according to one embodiment of the invention is explained below.

The glass substrate according to one embodiment of the invention is preferably produced through the steps of melting, refining, forming, slow cooling, and cutting.

In the melting step, raw materials are prepared so as to result in a desired glass composition, and the raw materials are introduced into a melting furnace and heated to preferably about 1,450-1,650° C., thereby obtaining a molten glass.

As the raw materials, use may be made of oxides, carbonates, nitrates, and hydroxides. Other materials including halides such as chlorides can also be used if desired. In the case where the process includes a step in which the molten glass comes into contact with platinum as in the melting step or refining step, fine platinum particles may come into the molten glass and be included as foreign matter in the glass substrate obtained. Nitrates have the effect of preventing the inclusion of platinum as foreign matter and, hence, use thereof as raw materials is preferred.

Usable as the nitrates are strontium nitrate, barium nitrate, magnesium nitrate, calcium nitrate, and the like. More preferred is to use strontium nitrate. With respect to the particle size of the raw materials, use may be suitably made of raw materials ranging from raw materials having such a large particle diameter of several hundred micrometers that the particles do not remain unmelted to raw materials having such a small particle diameter of several micrometers that the particles neither fly off during raw-material conveyance nor aggregate into secondary particles. Use of granules is possible. Melting conditions including water content, β-OH, and the degree of oxidation/reduction of Fe or redox [$Fe^{2+}$/($Fe^{2+}+Fe^{3+}$)] can also be suitably regulated.

In the refining step, $SO_3$ or $SnO_2$ can be used as a refining agent for the glass substrate according to the invention. A method of degassing under reduced pressure may be applied. Preferred $SO_3$ sources are the sulfates of at least one element selected from Al, Mg, Ca, Sr, and Ba. More preferred are the sulfates of the alkaline earth metals. Preferred of these are $CaSO_4.2H_2O$, $SrSO_4$, and $BaSO_4$, because these sulfates are highly effective in enlarging bubbles.

As a refining agent for the method for degassing performed under reduced pressure, it is preferred to use a halogen such as Cl or F. Preferred Cl sources are the chlorides of at least one element selected from Al, Mg, Ca, Sr, and Ba. More preferred are the chlorides of the alkaline earth metals. Especially preferred of these are $SrCl_2.6H_2O$ and $BaCl_2.2H_2O$, because these chlorides are highly effective in enlarging bubbles and have low deliquescence.

Preferred F sources are the fluorides of at least one element selected from Al, Mg, Ca, Sr, and Ba. More preferred are the fluorides of the alkaline earth metals. Even more preferred of these is $CaF_2$, because this fluoride is highly effective in enhancing the meltability of raw glass materials.

In the forming step, the float process is used in which the molten glass is poured onto a molten metal to obtain a plate-shaped glass ribbon.

In the slow cooling step, the glass ribbon is slowly cooled.

In the cutting step, the glass ribbon after the slow cooling is cut into a given size to obtain a glass substrate.

The present invention is not limited to the embodiments described above. Modifications, improvements, and the like made within a range where the objects of the invention can be achieved are included in the invention.

For example, in the case of producing a glass substrate according to one embodiment of the invention, use may be made of the fusion process, press forming, or the like in the forming step to form the molten glass into a plate shape.

A platinum crucible may be used in producing a glass substrate according to one embodiment of the invention. In the case of using a platinum crucible, the melting step may be performed in the following manner. Raw materials are prepared so as to result in the composition of the glass substrate to be obtained, and the platinum crucible containing the raw materials is introduced into an electric furnace. The raw materials are heated to preferably about 1,450-1,650° C., and a platinum stirrer is inserted thereinto to stir the contents for 1-3 hours, thereby obtaining a molten glass.

The glass substrate obtained by the cutting may be heated, for example, to a temperature higher by about 50° C. than the glass transition temperature Tg and then gradually cooled to a room-temperature state. Thus, the residual strain in the glass substrate can be removed.

EXAMPLES

The present invention is explained below in detail by reference to Examples, but the invention is not limited to the following Examples.

Various raw glass materials including silica sand were mixed so as to result in each of the glass compositions shown in Tables 1 to 3. A sulfate was added to the mixed raw materials so as to result in each desired composition, in an amount of 0.1-1% in terms of $SO_3$ amount in percent by mass on an oxide amount basis, and Cl was added thereto in an amount of 0.1-1%, the amount of the raw materials being taken as 100%. Using a platinum crucible, each resultant mixture was melted by heating at a temperature of 1,550-1,650° C. for 3 hours. During the melting, a platinum stirrer was inserted to stir the melt for 1 hour to homogenize the glass. The molten glass was subsequently poured out and formed into a plate shape. The plate-shaped glass was introduced into an electric furnace having a temperature higher by about 50° C. than the glass transition temperature Tg, and the temperature of the electric furnace was lowered at a cooling rate of 1° C./min until the glass was cooled to room temperature.

The glasses obtained were measured for the average coefficient of thermal expansion (unit: ppm/° C.), density (unit: g/cm$^3$), Young's modulus (unit: GPa), photoelastic constant (nm/cm/MPa), glass transition temperature Tg (unit: ° C.), $T_4$ (unit: ° C.), $T_2$ (unit: ° C.), devitrification temperature (unit: ° C.), and devitrification-temperature viscosity (dPa·s). The results thereof are shown in Tables 1 and 3.

Each glass had a content of alkali metal oxides of 0.1% or less as represented by molar percentage based on oxides. Each glass had a content of residual $Fe_2O_3$ of 10-300 ppm and a content of residual $SO_3$ of 10-300 ppm.

The methods used for determining the properties are shown below. In Tables 1 to 3, each blank indicates that the property was not measured.

(Average Coefficient of Thermal Expansion)

A differential dilatometer (TMA) was used to make a measurement in accordance with the method as provided for in JIS R3102 (year 1995). The measurement was made over the two temperature ranges of 30-220° C. and 50-350° C. In the tables, the average coefficient of thermal expansion for the measurement temperature range of 30–220° C., the unit of which is ppm/° C., is indicated by CTE(30-220), while the average coefficient of thermal expansion for the measurement temperature range of 50–350° C., the unit of which is ppm/° C., is indicated by CTE(50-350).

(Density)

Glass masses weighing about 20 g and containing no bubbles were measured by Archimedes' method to determine the density.

(Young's Modulus)

A glass having a thickness of 0.5-10 mm was measured for Young's modulus by an ultrasonic pulse method.

(Glass Transition Temperature Tg)

A TMA was used to measure Tg in accordance with the method as provided for in JIS R3103-3 (year 2001).

($T_4$)

A rotational viscometer was used to measure the viscosity to determine the temperature $T_4$ (° C.) at which the viscosity was $10^4$ dPa·s.

($T_2$)

A rotational viscometer was used to measure the viscosity to determine the temperature $T_2$ (° C.) at which the viscosity was $10^2$ dPa·s.

(Devitrification Temperature)

The devitrification temperature was determined in the following manner. Crushed particles of a glass were placed on a platinum dish and heat-treated for 17 hours in an electric furnace controlled so as to have a constant temperature. The heat-treated glass was examined with an optical microscope to determine a highest temperature at which crystal precipitation occurred in neither the glass surface nor the inside thereof. The highest temperature was taken as the devitrification temperature.

(Devitrification-Temperature Viscosity)

Using a rotational viscometer, a molten glass was measured for viscosity at high temperatures (1,000-1,600° C.). From the results thereof, the constants of the Fulcher equation were determined. The devitrification-temperature viscosity was determined using the Fulcher equation containing the constants.

(Photoelastic Constant)

A measurement was made by the disk compression method described in Yōgyō Kyōkai-shi, Vol. 87, No. 10 (1979), p. 519.

TABLE 1

| | | Ex. 1 | Ex. 2 | Ex. 3 | Ex. 4 | Ex. 5 | Ex. 6 | Ex. 7 | Ex. 8 |
|---|---|---|---|---|---|---|---|---|---|
| Composition (mol %) | $SiO_2$ | 59 | 60 | 58.5 | 60 | 58.5 | 58.7 | 58 | 60 |
| | $Al_2O_3$ | 5 | 3.6 | 5 | 4 | 5 | 5 | 5 | 3.3 |
| | $B_2O_3$ | 0 | 0 | 1 | 0 | 0 | 0 | 0 | 0 |
| | MgO | 1 | 1.7 | 1 | 1.7 | 1.7 | 1.7 | 1.7 | 1.7 |
| | CaO | 1.5 | 4 | 1 | 2 | 4.5 | 4 | 5 | 5 |
| | SrO | 14.5 | 11.7 | 14.5 | 13.3 | 11.7 | 11.6 | 11.7 | 11.4 |
| | BaO | 19 | 19 | 19 | 19 | 18.6 | 19 | 18.6 | 18.6 |
| | MgO + CaO + SrO + BaO | 36.0 | 36.4 | 35.5 | 36.0 | 36.5 | 36.3 | 37.0 | 36.7 |
| | $Na_2O$ | 0 | 0 | 0 | 0 | 0 | 0 | 0 | 0 |
| | $K_2O$ | 0 | 0 | 0 | 0 | 0 | 0 | 0 | 0 |
| | Content of alkali metal oxides | 0 | 0 | 0 | 0 | 0 | 0 | 0 | 0 |
| CTE(30-220) [ppm/° C.] | | 8.20 | 8.19 | 8.18 | 8.22 | 7.93 | 8.03 | 8.13 | 8.18 |
| CTE(50-350) [ppm/° C.] | | 8.54 | 8.52 | 8.50 | 8.56 | 8.30 | 8.40 | 8.45 | 8.52 |
| Density [g/cm³] | | 3.54 | 3.51 | 3.57 | 3.53 | 3.50 | 3.51 | 3.51 | 3.50 |
| Young's modulus (GPa) | | 75.9 | 76.4 | 77.3 | 76.5 | 78.5 | 77.8 | 78.5 | 76.7 |
| Photoelastic constant (nm/cm/MPa) | | | 16.6 | | 16.5 | | | | |
| $T_g$ [° C.] | | 714 | 705 | 694 | 705 | 711 | 712 | 712 | 702 |
| $T_4$ [° C.] | | 1100 | 1091 | 1084 | 1095 | | | | |
| $T_2$ [° C.] | | 1370 | 1358 | 1354 | 1367 | | | | |
| Devitrification temperature [° C.] | | 1160-1180 | 1140-1160 | 1140-1160 | 1140-1160 | 1160-1180 | 1140-1160 | 1120-1140 | 1140-1160 |
| Devitrification-temperature viscosity [dPa · s] | | $10^{3.20}$ | $10^{3.50}$ | $10^{3.26}$ | $10^{3.35}$ | | | | |

TABLE 2

| | | Ex. 9 | Ex. 10 | Ex. 11 | Ex. 12 | Ex. 13 | Ex. 14 | Ex. 15 | Ex. 16 | Ex. 17 |
|---|---|---|---|---|---|---|---|---|---|---|
| Composition (mol %) | $SiO_2$ | 58.5 | 60 | 58.3 | 58.4 | 60 | 60 | 61.6 | 58.8 | 65.2 |
| | $Al_2O_3$ | 4 | 5 | 4.8 | 4.9 | 5 | 3 | 2 | 5.5 | 6.0 |
| | $B_2O_3$ | 1.5 | 0 | 1 | 0 | 0 | 0 | 0 | 0 | 0 |
| | MgO | 1 | 1 | 0.9 | 1.7 | 1.7 | 1 | 2.4 | 2.0 | 7.9 |
| | CaO | 1.5 | 2 | 4 | 5 | 5 | 4.5 | 2 | 6.1 | 7.0 |
| | SrO | 14.5 | 7 | 12 | 11 | 9.7 | 7.5 | 16 | 14.3 | 1.0 |
| | BaO | 19 | 25 | 19 | 19 | 18.6 | 24 | 16 | 13.3 | 0.0 |
| | MgO + CaO + SrO + BaO | 36.0 | 35.0 | 35.9 | 36.7 | 35.0 | 37.0 | 36.4 | 35.7 | 15.9 |
| | $Na_2O$ | 0 | 0 | 0 | 0 | 0 | 0 | 0 | 0 | 5.1 |
| | $K_2O$ | 0 | 0 | 0 | 0 | 0 | 0 | 0 | 0 | 6.5 |
| | Content of alkali metal oxides | 0 | 0 | 0 | 0 | 0 | 0 | 0 | 0 | 11.6 |
| CTE(30-220) [ppm/° C.] | | 8.36 | 8.29 | 8.08 | 8.05 | 7.83 | 8.49 | 8.25 | 7.76 | |
| CTE(50-350) [ppm/° C.] | | 8.70 | 8.63 | 8.44 | 8.34 | 8.17 | 8.93 | 8.57 | 8.07 | 8.36 |
| Density [g/cm³] | | 3.56 | 3.59 | 3.51 | 3.50 | 3.45 | 3.59 | 3.46 | 3.37 | 2.55 |
| Young's modulus (GPa) | | 76.9 | 74.2 | 77.8 | 77.7 | | 74.0 | 76.2 | | 77 |

TABLE 2-continued

|  | Ex. 9 | Ex. 10 | Ex. 11 | Ex. 12 | Ex. 13 | Ex. 14 | Ex. 15 | Ex. 16 | Ex. 17 |
|---|---|---|---|---|---|---|---|---|---|
| Photoelastic constant (nm/cm/MPa) | 16.7 | 16.2 |  |  |  |  |  |  | 27 |
| $T_g$ [° C.] | 686 | 710 | 696 | 713 | 719 | 697 | 693 |  | 645 |
| $T_4$ [° C.] |  |  |  | 1098 | 1109 |  |  | 1108 | 1178 |
| $T_2$ [° C.] |  |  |  | 1364 | 1387 |  |  | 1378 | 1599 |
| Devitrification temperature [° C.] | 1140-1160 | >1160 | 1120-1140 | 1100-1120 | 1050-1070 |  |  | 1160-1180 | 1190 |
| Devitrification-temperature viscosity [dPa·s] |  |  |  | $10^{3.75}$ |  |  |  | $10^{3.28}$ | $10^{3.92}$ |

TABLE 3

|  |  | Ex. 18 | Ex. 19 | Ex. 20 | Ex. 21 | Ex. 22 | Ex. 23 | Ex. 24 |
|---|---|---|---|---|---|---|---|---|
| Composition (mol %) | $SiO_2$ | 60 | 60 | 60 | 60 | 58.3 | 58.4 | 58.4 |
|  | $Al_2O_3$ | 4.3 | 4.3 | 4.3 | 4.3 | 4.9 | 4.9 | 4.9 |
|  | $B_2O_3$ | 0 | 0 | 0 | 0 | 0 | 0 | 0 |
|  | MgO | 1 | 1 | 1 | 1 | 1.8 | 1.7 | 1.7 |
|  | CaO | 4 | 4 | 4 | 4 | 5 | 5 | 6 |
|  | SrO | 10.7 | 9.7 | 8.7 | 7.7 | 10 | 9.5 | 8.5 |
|  | BaO | 20 | 21 | 22 | 23 | 20 | 20.5 | 20.5 |
|  | MgO + CaO + SrO + BaO | 35.7 | 35.7 | 35.7 | 35.7 | 36.8 | 36.7 | 36.7 |
|  | $Na_2O$ | 0 | 0 | 0 | 0 | 0 | 0 | 0 |
|  | $K_2O$ | 0 | 0 | 0 | 0 | 0 | 0 | 0 |
|  | Content of alkali metal oxides | 0 | 0 | 0 | 0 | 0 | 0 | 0 |
| CTE(30-220) [ppm/° C.] |  |  |  |  |  | 8.10 | 8.07 | 8.04 |
| CTE(50-350) [ppm/° C.] |  |  |  |  |  | 8.43 | 8.39 | 8.37 |
| Density [g/cm³] |  | 3.52 | 3.53 | 3.54 | 3.56 | 3.52 | 3.52 | 3.50 |
| Young's modulus (GPa) |  | 77.2 | 76.3 | 76.3 | 75.6 | 77.6 | 77.6 | 77.8 |
| Photoelastic constant (nm/cm/MPa) |  |  |  |  |  | 16.5 |  |  |
| $T_g$ [° C.] |  | 705 | 706 | 706 | 706 | 715 | 714 | 714 |
| $T_4$ [° C.] |  |  |  |  |  | 1094 | 1094 | 1089 |
| $T_2$ [° C.] |  |  |  |  |  | 1360 | 1362 | 1357 |
| Devitrification temperature [° C.] |  | 1145-1150 | 1155-1160 | 1155-1160 | 1155-1160 | 1105 | 1105 | 1105 |
| Devitrification-temperature viscosity [dPa·s] |  |  |  |  |  | $10^{3.88}$ |  |  |

|  |  | Ex. 25 | Ex. 26 | Ex. 27 | Ex. 28 | Ex. 29 |
|---|---|---|---|---|---|---|
| Composition (mol %) | $SiO_2$ | 57.4 | 58.3 | 58.3 | 58.3 | 58.7 |
|  | $Al_2O_3$ | 5.9 | 4.9 | 4.9 | 4.9 | 4.9 |
|  | $B_2O_3$ | 0 | 0 | 0 | 0 | 0 |
|  | MgO | 1.7 | 0 | 1 | 1 | 0.8 |
|  | CaO | 5 | 6 | 5.8 | 5 | 5.6 |
|  | SrO | 9.5 | 10.8 | 10 | 10.8 | 10 |
|  | BaO | 20.5 | 20 | 20 | 20 | 20 |
|  | MgO + CaO + SrO + BaO | 36.7 | 36.8 | 36.8 | 36.8 | 36.4 |
|  | $Na_2O$ | 0 | 0 | 0 | 0 | 0 |
|  | $K_2O$ | 0 | 0 | 0 | 0 | 0 |
|  | Content of alkali metal oxides | 0 | 0 | 0 | 0 | 0 |
| CTE(30-220) [ppm/° C.] |  | 8.05 | 8.18 | 8.15 | 8.28 | 8.18 |
| CTE(50-350) [ppm/° C.] |  | 8.38 | 8.51 | 8.51 | 8.63 | 8.50 |
| Density [g/cm³] |  | 3.52 | 3.53 | 3.52 | 3.54 | 3.52 |
| Young's modulus (GPa) |  | 79.3 | 77.5 | 79.1 | 78.3 | 78.5 |
| Photoelastic constant (nm/cm/MPa) |  |  |  | 16.4 |  | 16.6 |
| $T_g$ [° C.] |  | 720 | 714 | 716 | 716 | 714 |
| $T_4$ [° C.] |  |  | 1099 | 1099 |  | 1093 |
| $T_2$ [° C.] |  |  | 1362 | 1359 |  | 1362 |
| Devitrification temperature [° C.] |  | >1180 | >1130 | 1095-1100 | >1110 | 1095 |
| Devitrification-temperature viscosity [dPa·s] |  |  |  | $10^{4.00}$ |  | $10^{3.98}$ |

In Tables 1 to 3, Examples 1 to 15 and 18 to 29 are working examples according to the present invention and Examples 16 and 17 are comparative examples.

As shown in Tables 1 to 3, the glass substrates of Examples 1 to 15 and 18 to 29, which are working examples according to the present invention, each had a devitrification-temperature viscosity of $10^{3.2}$ dPa·s or higher and an average coefficient of thermal expansion α at 30-220° C. in the range of 7.80-9.00 (ppm/° C.).

It can hence been seen that the glass substrates of the working examples according to the present invention are ones produced from glasses showing stable formability and can be made to have a coefficient of thermal expansion which matches with that of an encapsulation resin to be used in a heat treatment step in which semiconductor substrates that have been laminated with each glass substrate are embedded in the encapsulation resin (resin encapsulation), and that the package as a whole obtained by the embedding in the encapsulation resin can be inhibited or prevented from warping.

Furthermore, it can be seen that since the glass substrates of the working examples according to the present invention each have an alkali metal oxide content of 0.1% or less as represented by molar percentage based on oxides, alkali ions are less apt to diffuse into semiconductor substrates in a heat treatment step for sticking the semiconductor substrates, e.g., silicon substrates, to each glass substrate and in a heat treatment step for embedding the semiconductor substrates in an encapsulation resin (resin encapsulation).

Meanwhile, the glass substrate of Comparative Example 16 had an average coefficient of thermal expansion α at 30-220° C. of less than 7.80 (ppm/° C.), which was lower than those of the Examples according to the present invention. It can hence been seen that it is difficult to make the glass substrate of the Example 16 have a coefficient of thermal expansion which matches with that of an encapsulation resin to be used in a heat treatment step in which semiconductor substrates that have been laminated to the glass substrate are embedded in the encapsulation resin (resin encapsulation), and that it is difficult to inhibit the package as a whole obtained by the embedding in the encapsulation resin from warping.

The glass substrate of Comparative Example 17 had an alkali metal oxide content of 0.1% or higher. It can hence be seen that there is a possibility that alkali metal oxide ions might undesirably diffuse into semiconductor substrates, for example, in a heat treatment step. Furthermore, the glass substrate had a photoelastic constant higher than 26 nm/cm/MPa, showing that use of this glass substrate as a support substrate for semiconductor packages may result in failures.

Although the invention has been described in detail with reference to embodiments thereof, the invention is not limited to the embodiments and can be modified or altered in any way within the scope of the invention.

While the invention has been described in detail and with reference to specific embodiments thereof, it will be apparent to one skilled in the art that various changes and modifications can be made therein without departing from the spirit and scope thereof. This application is based on a Japanese patent application filed on Sep. 16, 2016 (Application No. 2016-182125) and a Japanese patent application filed on Mar. 23, 2017 (Application No. 2017-57619), the entire contents thereof being incorporated herein by reference. All the references cited herein are incorporated as a whole.

DESCRIPTION OF THE REFERENCE NUMERALS AND SIGNS

10, 40 Silicon substrate
20, 50 Release layer
30, 70, 80 Laminated substrate
60 Resin
G1, G2, G3, G4 Glass substrate
90 Support substrate

The invention claimed is:

1. A glass substrate comprising:
   a content of alkali metal oxides, as represented by molar percentage based on oxides, of 0 to 0.1%;
   a devitrification-temperature viscosity of $10^{3.2}$ dPa·s or higher; and
   an average coefficient of thermal expansion α at 30 to 220° C. of 7.80 to 9.00 (ppm/° C.).

2. The glass substrate according to claim 1, wherein the glass substrate is configured to be used for a support substrate for semiconductor packages.

3. The glass substrate according to claim 1, further comprising a photoelastic constant of 10 to 26 nm/cm/MPa.

4. The glass substrate according to claim 1, further comprising a glass matrix composition consisting essentially of a composition, as represented by molar percentage based on oxides,
   $SiO_2$: 50 to 70%,
   $Al_2O_3$: 2 to 8%,
   $B_2O_3$: 0 to 5%,
   MgO: 0 to 5%,
   CaO: 0 to 6%,
   SrO: 4 to 20%, and
   BaO: 14 to 35%,
   provided that MgO+CaO+SrO+BaO: 25 to 40%.

5. The glass substrate according to claim 1, further comprising a value as determined by the following expression (1) of 81 to 93, the expression (1) showing a relationship of each content proportion of oxides as represented by molar percentage based on oxides:

$$0.174\times(\text{content of SiO}_2)-0.012\times(\text{content of Al}_2\text{O}_3)+0.317\times(\text{content of B}_2\text{O}_3)+0.988\times(\text{content of MgO})+1.715\times(\text{content of CaO})+2.011\times(\text{content of SrO})+2.251\times(\text{content of BaO})+0.076 \quad (1).$$

6. The glass substrate according to claim 1, further comprising a total content of $SiO_2$ and $Al_2O_3$ of 60% or higher.

7. The glass substrate according to claim 1, further comprising a transmittance of 360 nm-wavelength light of 15% or higher at a thickness of 1 mm.

8. The glass substrate according to claim 1, further comprising a glass devitrification temperature of 1,250° C. or lower.

9. The glass substrate according to claim 1, further comprising a Young's modulus of 65 GPa or higher.

10. The glass substrate according to claim 1, further comprising a thickness of 2.0 mm or less.

11. The glass substrate according to claim 1, further comprising one main surface having an area of 70 to 7,000 $cm^2$.

12. A laminated substrate comprising the glass substrate according to claim 11 and a semiconductor substrate laminated via a resin layer, wherein the semiconductor substrate is supported by the glass substrate.

13. The glass substrate according to claim 1, further comprising a β-OH of 0.05 to 0.65 $mm^{-1}$.

14. The glass substrate according to claim 1, further comprising a light-shielding film on at least one main surface of the glass substrate.

15. A laminated glass substrate comprising the glass substrate according to claim 1 and another glass substrate laminated therewith.

16. A laminated substrate comprising the glass substrate according to claim 1 and a semiconductor substrate laminated via a resin layer, wherein the semiconductor substrate is supported by the glass substrate.

17. The laminated substrate according to claim 16, further comprising another glass substrate laminated on an opposite side of a surface of the glass substrate where the semiconductor substrate is laminated.

18. A glass substrate comprising:
 a content of alkali metal oxides, as represented by molar percentage based on oxides, of 0 to 0.1%; a devitrification-temperature viscosity of $10^{3.2}$ dPa·s or higher;
 an average coefficient of thermal expansion a at 30 to 220° C. of 7.80 to 9.00 (ppm/° C.); and
 a photoelastic constant of 10 to 26 nm/cm/MPa,
 wherein the glass substrate is configured to be used for a support substrate for semiconductor packages.

* * * * *